United States Patent
Barratt et al.

(10) Patent No.: US 7,656,002 B1
(45) Date of Patent: Feb. 2, 2010

(54) INTEGRATED BIPOLAR TRANSISTOR AND FIELD EFFECT TRANSISTOR

(75) Inventors: Curtis A. Barratt, Greensboro, NC (US); Michael T. Fresina, Greensboro, NC (US); Brian G. Moser, Jamestown, NC (US); Dain C. Miller, Greensboro, NC (US); Walter A. Wohlmuth, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 83 days.

(21) Appl. No.: 11/947,840

(22) Filed: Nov. 30, 2007

(51) Int. Cl.
  *H01L 31/058* (2006.01)
  *H01L 21/8238* (2006.01)

(52) U.S. Cl. .......... 257/474; 257/197; 257/370; 257/378; 257/539; 257/552; 257/565; 257/E29.03; 257/E29.033; 257/E29.034; 257/E29.044; 257/E29.171; 257/E29.182; 257/E27.015; 257/E27.109; 438/235

(58) Field of Classification Search ........... 257/197, 257/539, 552, E29.03, E29.033, E29.034, 257/E29.044, 370, 378, 474, 565, E29.171, 257/E29.182, E27.015, E27.109; 438/235
See application file for complete search history.

(56) References Cited

U.S. PATENT DOCUMENTS

| 5,250,826 | A  |   | 10/1993 | Chang et al. |
|---|---|---|---|---|
| 5,391,257 | A  | * | 2/1995  | Sullivan et al. ............ 438/458 |
| 6,906,359 | B2 | * | 6/2005  | Zampardi et al. ........... 257/197 |
| 2005/0070113 | A1 | * | 3/2005 | Hanberg ..................... 438/706 |
| 2008/0026545 | A1 | * | 1/2008 | Cooke et al. ................ 438/478 |

OTHER PUBLICATIONS

Itakura, K. et al., "A GaAs Bi-FET Technology for Large Scale Integration," International Electron Devices Meeting, 1989, IEDM '89 Technical Digest, Dec. 1989, pp. 389-392, IEEE.

* cited by examiner

*Primary Examiner*—Long K Tran
(74) *Attorney, Agent, or Firm*—Withrow & Terranova, P.L.L.C.

(57) ABSTRACT

The present invention relates to a microelectronic device having a bipolar epitaxial structure that provides at least one bipolar transistor element formed over at least one field effect transistor (FET) epitaxial structure that provides at least one FET element. The epitaxial structures are separated with at least one separation layer. Additional embodiments of the present invention may use different epitaxial layers, epitaxial sub-layers, metallization layers, isolation layers, layer materials, doping materials, isolation materials, implant materials, or any combination thereof.

23 Claims, 9 Drawing Sheets

US 7,656,002 B1

INTEGRATED BIPOLAR TRANSISTOR AND FIELD EFFECT TRANSISTOR

FIELD OF THE INVENTION

The present invention relates to integration of bipolar transistor elements with field effect transistor elements.

BACKGROUND OF THE INVENTION

As semiconductor wafer fabrication evolves, element geometries become smaller, which provide greater densities that drive down costs, decrease device sizes, increase functionalities, enable increasing levels of integration, or any combination thereof. Certain applications require both bipolar and field effect transistor (FET) elements. Integration of bipolar transistors and FETs onto a single substrate may enable the realization of circuits and products with reduced size, cost, complexity, and improved performance. Thus, there is a need to integrate bipolar transistor elements and FET elements onto a common substrate.

SUMMARY OF THE INVENTION

The present invention relates to a microelectronic device having a bipolar epitaxial structure that provides at least one bipolar transistor element formed over at least one field effect transistor (FET) epitaxial structure providing at least one FET element. The epitaxial structures are separated with at least one separation layer. Additional embodiments of the present invention may use different epitaxial layers, epitaxial sub-layers, metallization layers, isolation layers, layer materials, doping materials, isolation materials, implant materials, or any combination thereof. Some embodiments of the present invention may be used in RF power amplifiers, RF switches, switching power supplies, low noise amplifiers, electrostatic protection devices, power detectors, decoder logic, voltage-controlled oscillators, mixers, and the like.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 5:
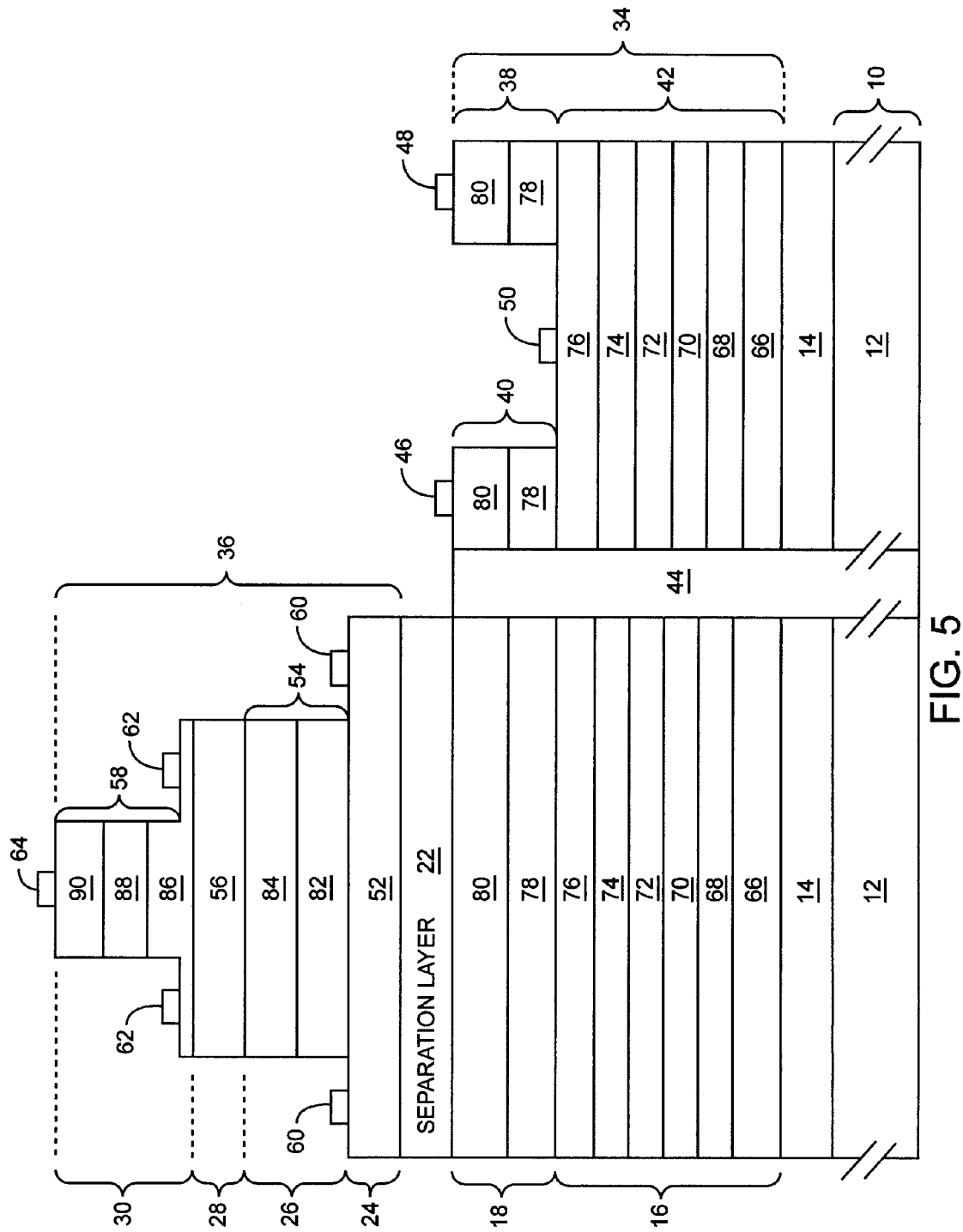
FIG. 5 shows details of the transistor elements illustrated in FIG. 2.
Figure 6A:
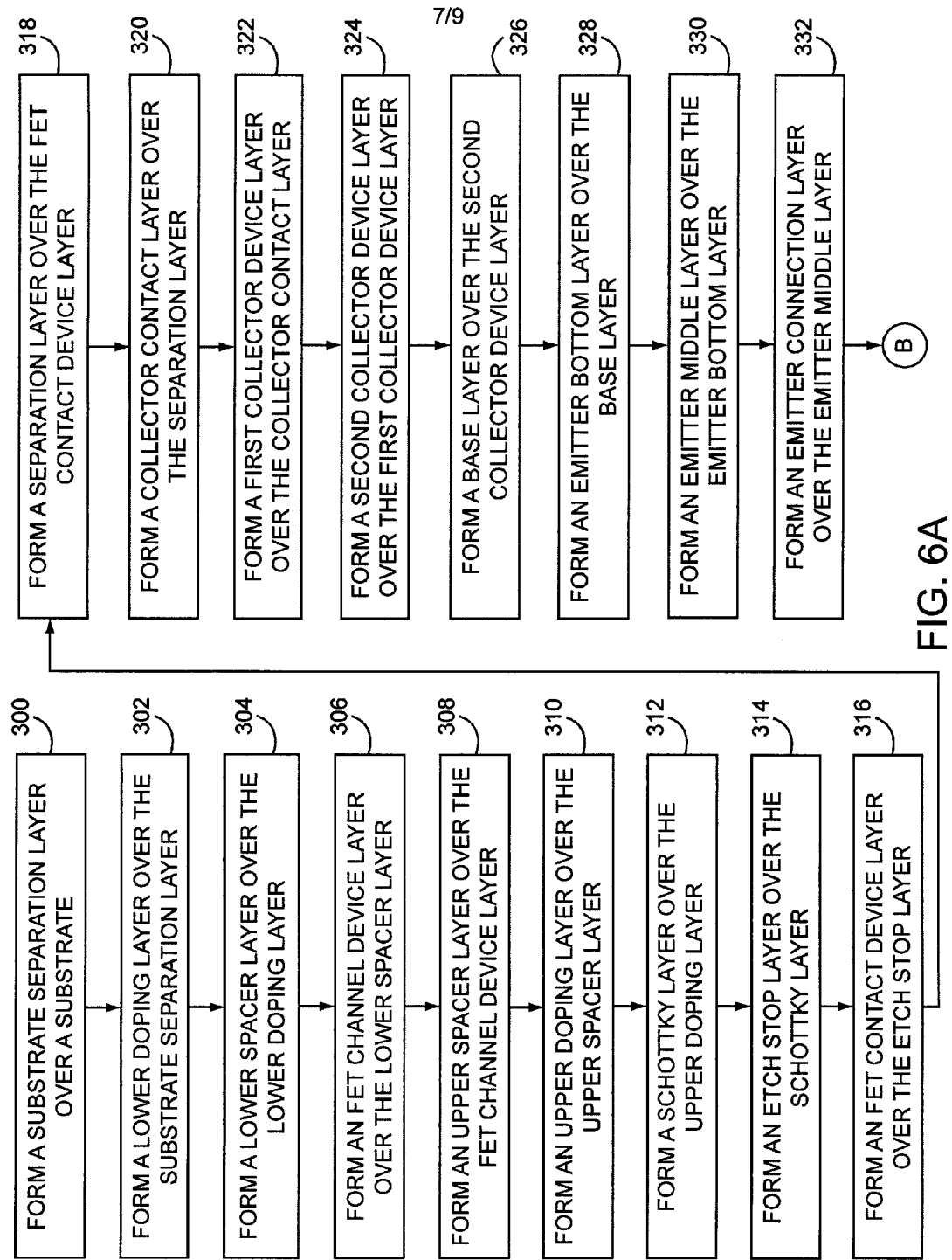
Figure 6B:
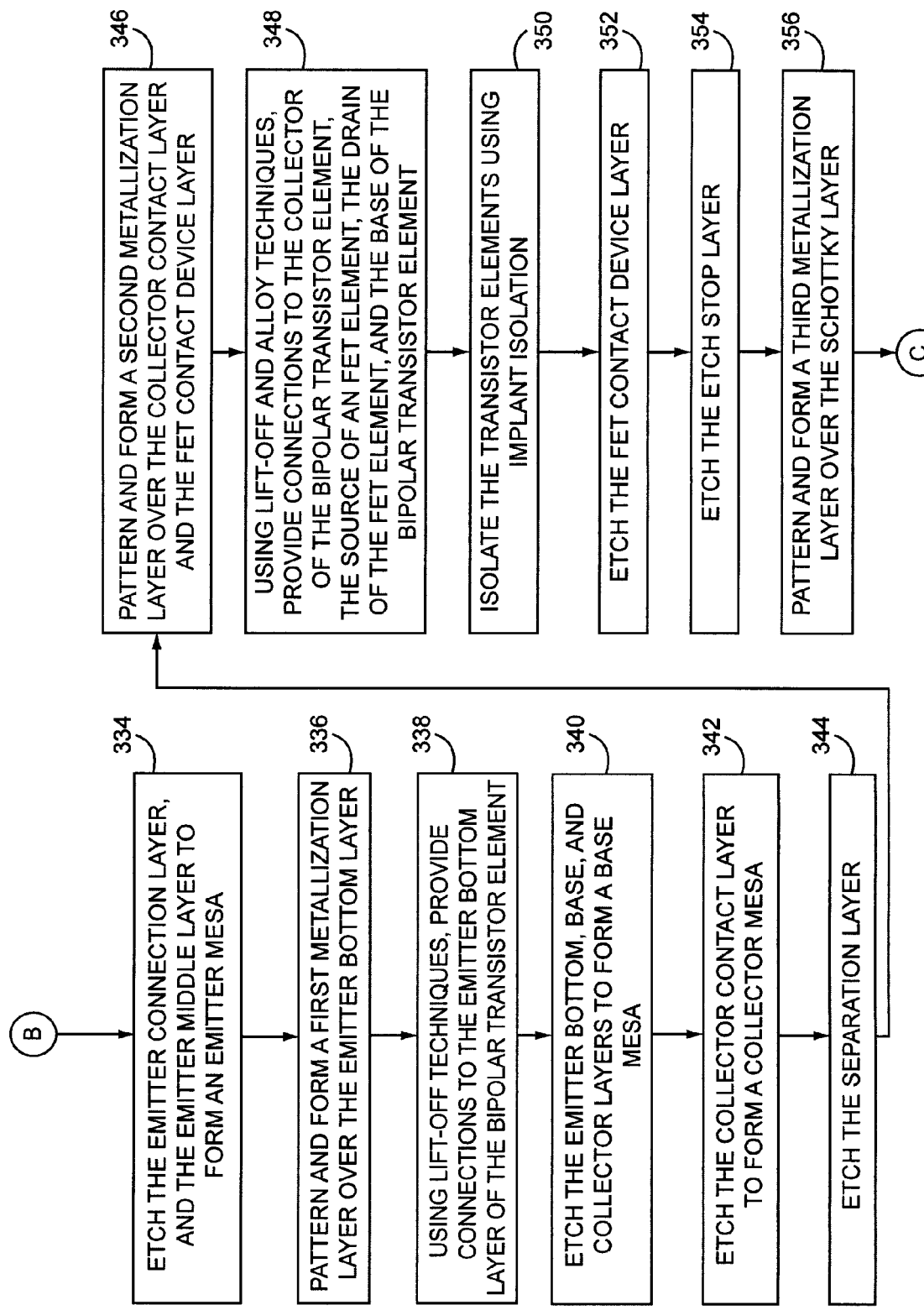
Figure 6C:
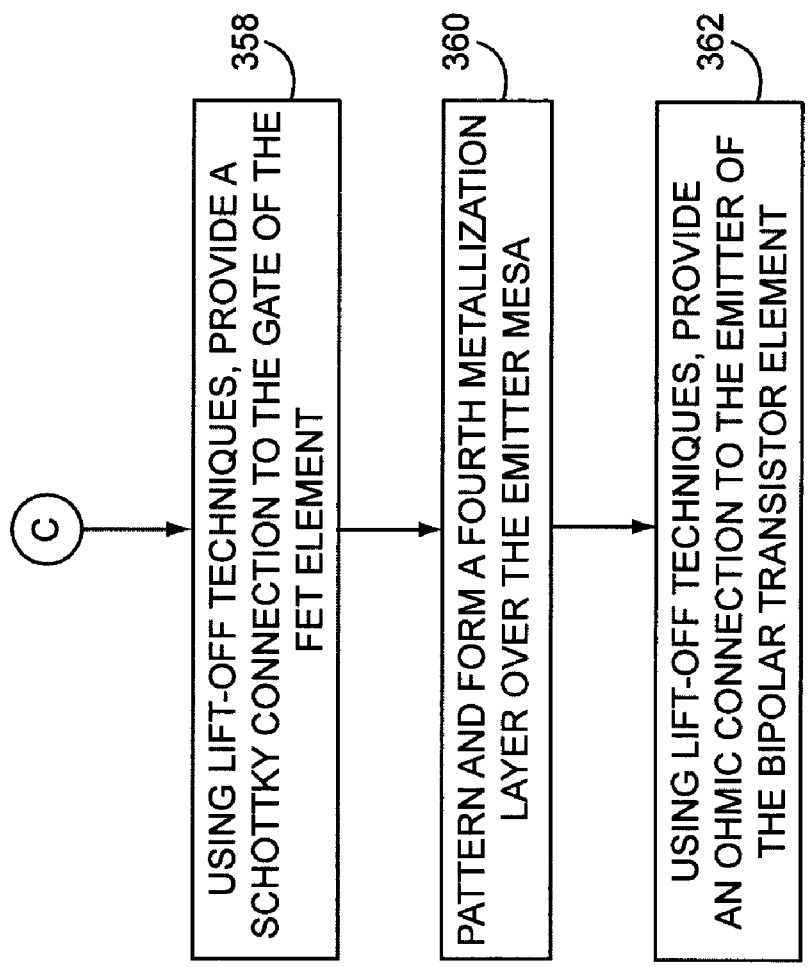

FIGS. 6A, 6B, and 6C illustrate a method for fabricating the transistor elements illustrated in FIG. 5.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a microelectronic device having a bipolar epitaxial structure that provides at least one bipolar transistor element formed over a field effect transistor (FET) epitaxial structure providing at least one FET element. The epitaxial structures are separated with at least one separation layer. Additional embodiments of the present invention may use different epitaxial layers, epitaxial sub-layers, metallization layers, isolation layers, layer materials, doping materials, isolation materials, implant materials, or any combination thereof.

Figure 1:
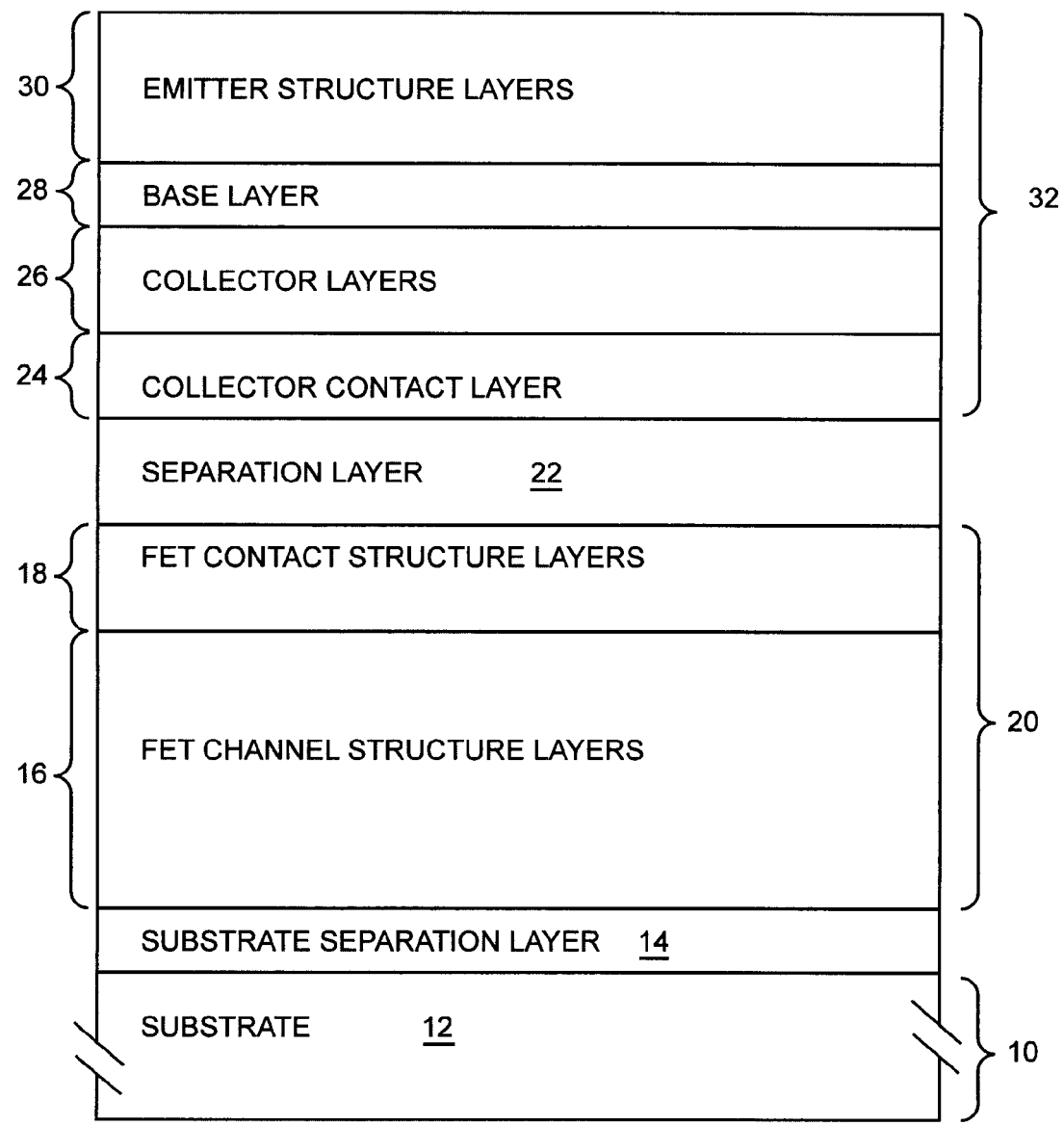
FIG. 1 shows field effect transistor (FET) epitaxial layers and bipolar transistor epitaxial layers, according to one embodiment of the present invention.

FIG. 1 shows FET epitaxial layers and bipolar transistor epitaxial layers, according to one embodiment of the present invention. FIG. 1 is not drawn to scale. A semiconductor wafer 10 having a substrate 12 is used as a base upon which to form epitaxial layers. The substrate 12 is Gallium Arsenide (GaAs). A substrate separation layer 14 is formed over the substrate 12. The substrate separation layer 14 may include GaAs, Aluminum Arsenide (AlAs), Aluminum Gallium Arsenide (AlGaAs), Indium Gallium Phosphide (InGaP), one or more layers of these materials, any combination thereof, or the like.

FET channel structure layers 16 are formed over the substrate separation layer 14. FET contact structure layers 18 are formed over the FET channel structure layers 16. The FET channel and FET contact structure layers 16, 18 form an FET epitaxial structure 20. A separation layer 22 is formed over the FET contact structure layers 18. The separation layer 22 may include AlAs, GaAs, AlGaAs, or InGaP. Alternate embodiments of the present invention may use multiple separation layers 22.

A collector contact layer 24 is formed over the separation layer 22. The collector contact layer 24 may include N-type GaAs. Alternate embodiments of the present invention may use multiple collector contact layers 24. Collector layers 26 are formed over the collector contact layer 24 and may include N-type GaAs. Alternate embodiments of the present invention may use a single collector layer 26. Alternate embodiments of the present invention may include compositional grading of the collector layers 26, grading of the doping profile with the collector layers 26, or combinations thereof. Additional embodiments of the present invention may include an additional separation layer between the collector layers 26 and the collector contact layer 24 to enable a base mesa etch to stop directly on top of the collector contact layer 24. This additional separation layer may be composed of GaAs, AlAs, AlGaAs, InGaP, or any combination thereof. A base layer 28 is formed over the collector layers 26 and may include P-type GaAs or P-type Indium Gallium Arsenide Nitride (InGaAsN), or any combination thereof. Alternate embodiments of the present invention may include multiple base layers 28. Additional embodiments of the present invention may include compositional grading of the base layers 28, grading of the doping profile with the base layers 28, or combinations thereof.

Emitter structure layers 30 are formed over the base layer 28. Alternate embodiments of the present invention may use a single emitter structure layer 30. Additional embodiments of the present invention may include compositional grading of the emitter structure layers 30, grading of the doping profile with the emitter structure layers 30, or combinations thereof. The collector contact, collector, base, and emitter structure layers 24, 26, 28, 30 form a bipolar epitaxial structure 32. Alternate embodiments of the present invention may incorporate additional layers, omit some layers, alter some layers, re-arrange the order of some layers, or any combination thereof. Any or all of the substrate separation layer 14, the FET channel and contact structure layers 16, 18, the separation layer 22, the collector layers 24, 26, the base layer 28, and the emitter structure layers 30, may include at least one semiconductor material.

Figure 2:
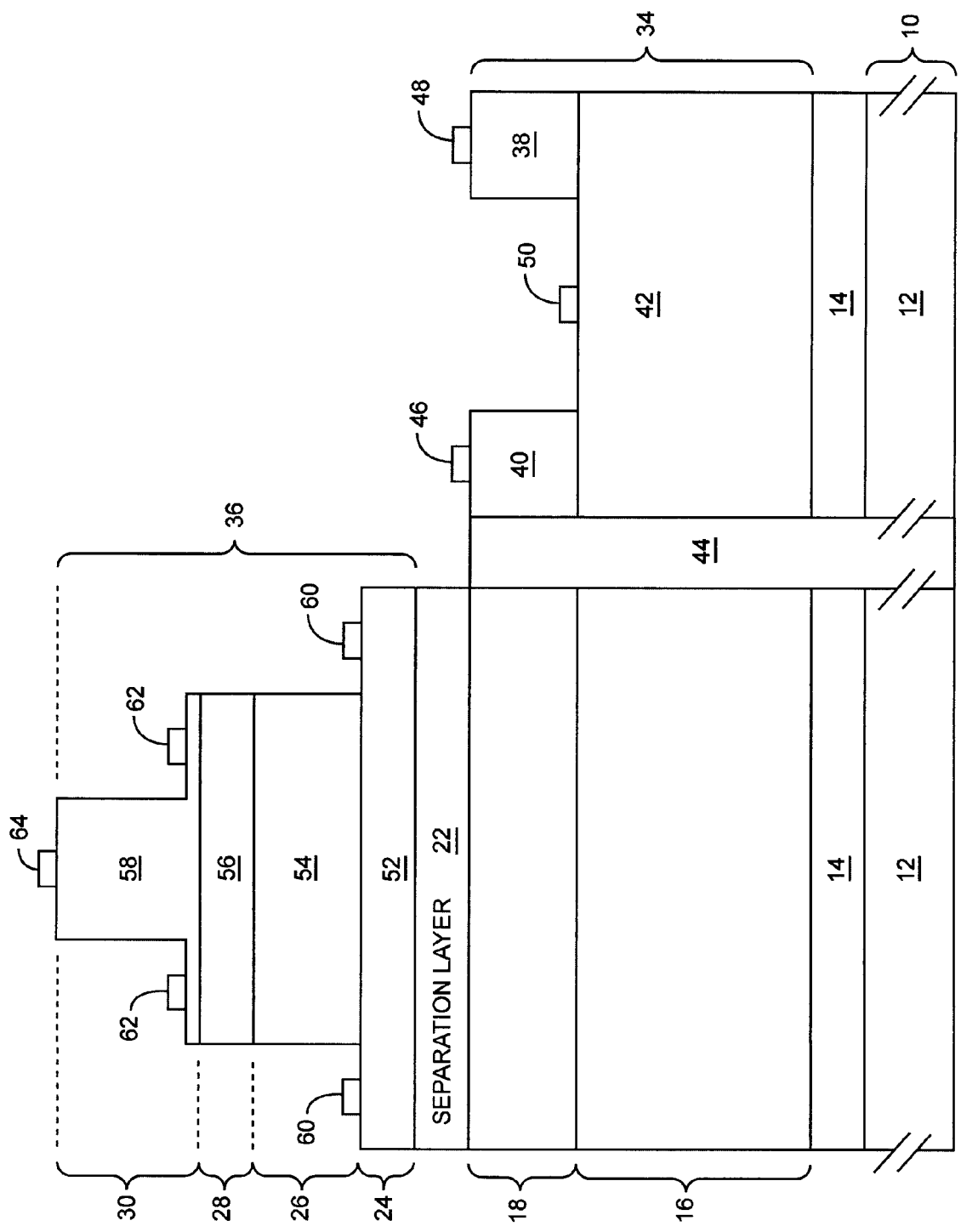
FIG. 2 shows the epitaxial structures illustrated in FIG. 1 providing an FET element and a bipolar transistor element.

FIG. 2 shows the epitaxial structures 20, 32 illustrated in FIG. 1 providing an FET element 34 and a bipolar transistor element 36. FIG. 2 is not drawn to scale. The FET contact structure layers 18 provide drain contact material 38 and source contact material 40 for the FET element 34. The FET channel structure layers 16 provide an FET channel 42 for the FET element 34. An isolated region 44 isolates the FET element 34 from the bipolar transistor element 36. A metallic source connection 46 provides an electrical connection to the source of the FET element 34. A metallic drain connection 48 provides an electrical connection to the drain of the FET element 34. A metallic gate connection 50 provides an electrical connection to the gate of the FET element 34. The collector contact layer 24 provides a collector mesa 52 and collector contact material for the bipolar transistor element 36. The collector layers 26 and the base layer 28 provide a base mesa 54, 56 for the bipolar transistor element 36. The emitter structure layers 30 provide an emitter mesa 58 for the bipolar transistor element 36. In one embodiment of the present invention, a thin section of the emitter structure layers 30 covers the base mesa 54, 56 to prevent exposure of the base layer 28. Exposure of the base layer 28 may cause performance degradation, reliability degradation, or both.

Metallic collector connections 60 provide electrical connections to the collector of the bipolar transistor element 36 through the collector contact material 52. Metallic base connections 62 may be diffused through the thin section of the emitter structure layers 30 into the base layer 28 to provide electrical connections to the base of the bipolar transistor element 36. Alternate embodiments of the present invention may form the metallic base connections 62 directly on top of the base layer 28. A metallic emitter connection 64 provides an electrical connection to the emitter of the bipolar transistor element 36.

The isolated region 44 may be formed using implant isolation, which may use Boron as an implant material. Alternate embodiments of the present invention may use other implant materials that are effective in isolating GaAs. Additional embodiments of the present invention may include one or more additional layers, omit one or more layers, change one or more layers, or any combination thereof.

The FET element 34 may form a pseudomorphic high electron mobility transistor element, a high electron mobility transistor element, a metal semiconductor field effect transistor element, a heterojunction insulated gate field effect transistor element, a modulation doped field effect transistor element, a junction field effect transistor element, or a heterostructure field effect transistor element. The bipolar transistor element 36 may provide a heterojunction bipolar transistor element. In an exemplary embodiment of the present invention, the FET element 34 provides a pseudomorphic high electron mobility transistor element and the bipolar transistor element 36 provides a heterojunction bipolar transistor element. Alternate embodiments of the present invention may provide any types or combinations of single or multiple FET elements 34, single or multiple bipolar transistor elements 36, or both. Alloy techniques may be used to form an alloy between any or all of the metallic connections 46, 48, 50, 60, 62, 64 and the semiconductor material to which they are attached to provide a low resistance ohmic connection. The doping of the semiconductor material may be high enough to negate the need for an alloy to form a low resistance ohmic connection between the metallic connections 46, 48, 60, 62, 64 and the semiconductor material. An alloy may be used to alter the Schottky barrier properties of the Schottky contact between the metallic gate connection 50 and the semiconductor material.

Figure 3A:
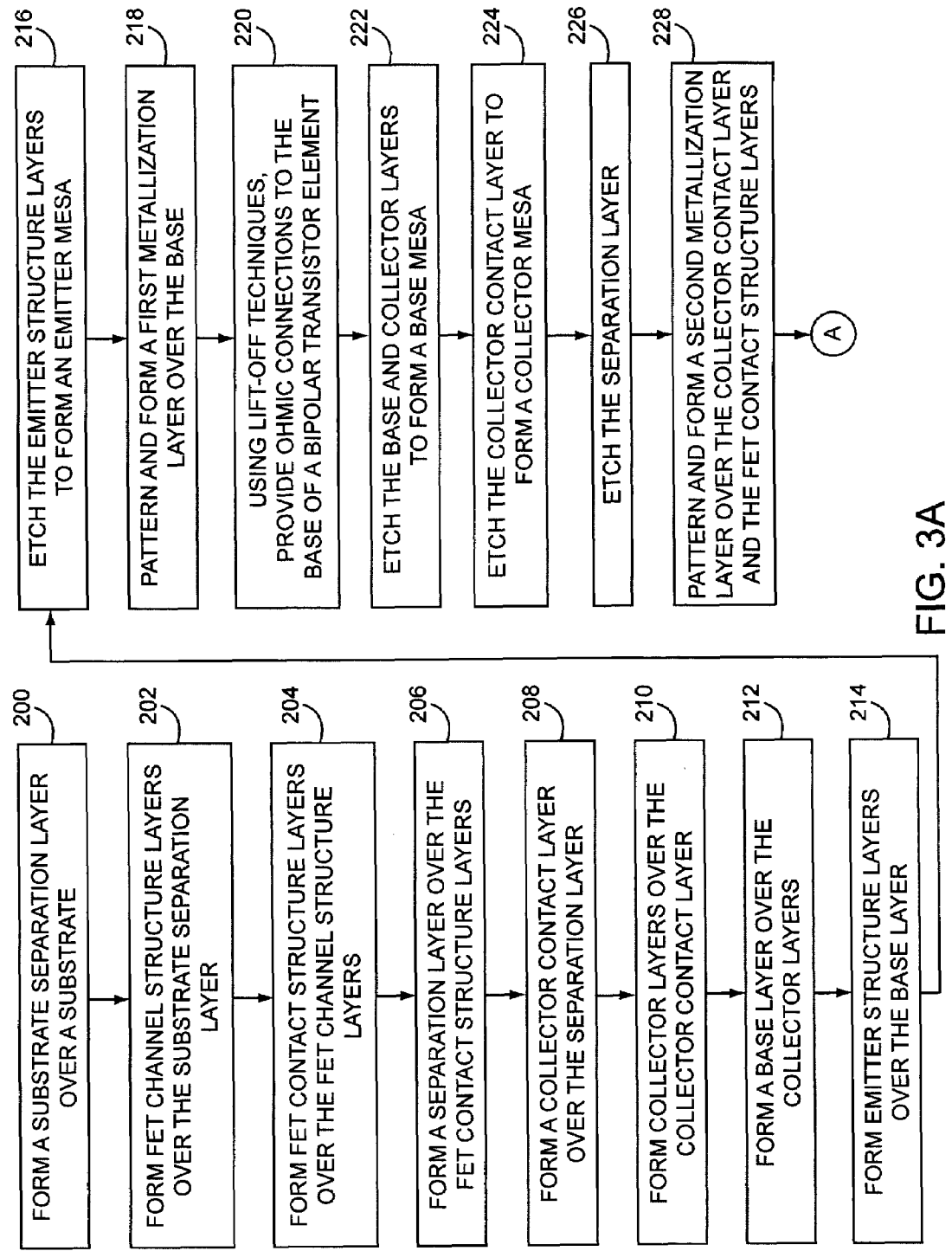
FIGS. 3A and 3B illustrate a method for fabricating the transistor elements illustrated in FIG. 2.
Figure 3B:
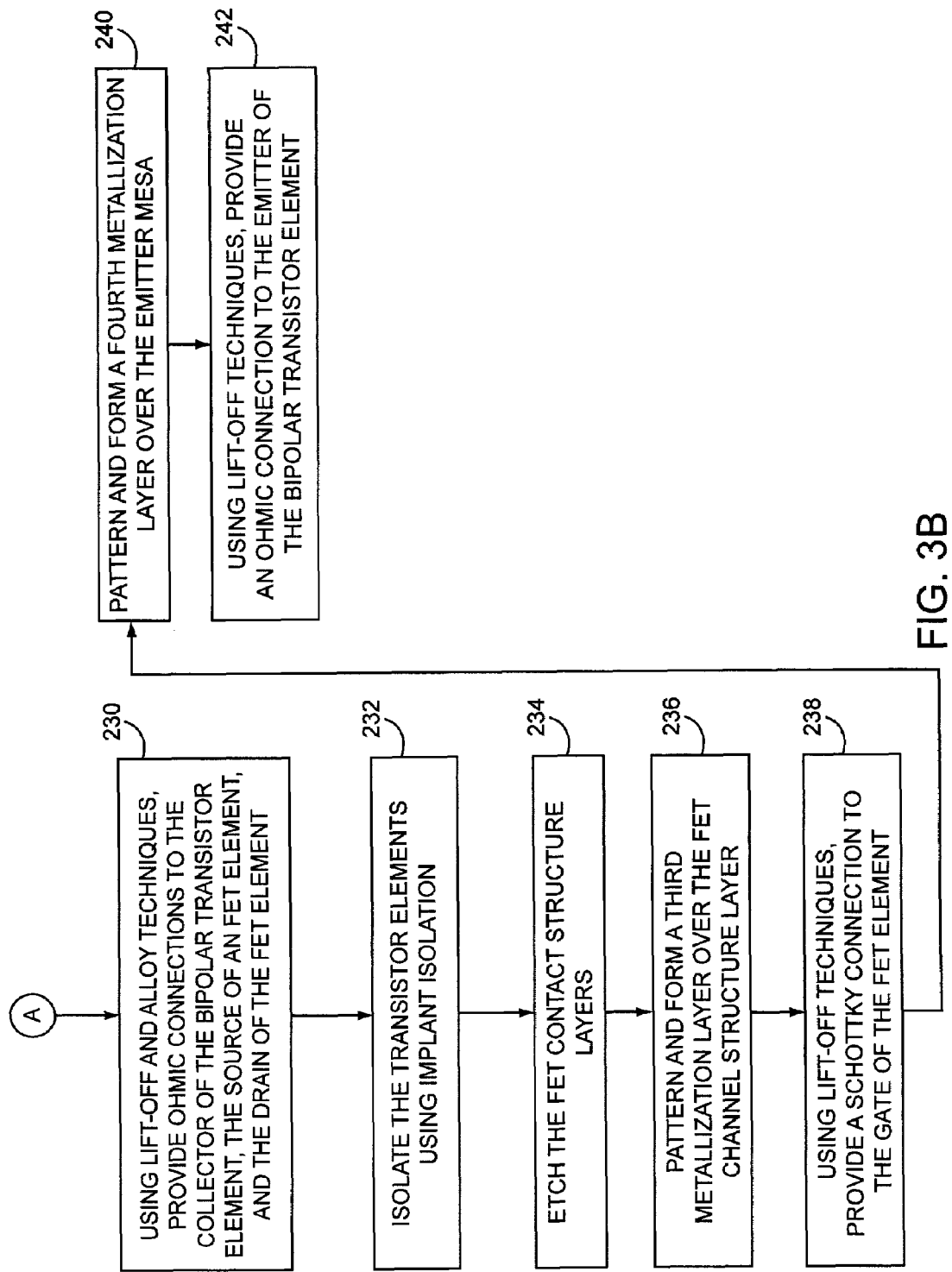

FIGS. 3A and 3B illustrate a method for fabricating the transistor elements 34, 36 illustrated in FIG. 2. First, the substrate separation layer 14 is formed over the substrate 12 (Step 200). Next, the FET channel structure layers 16 are formed over the substrate separation layer 14 (Step 202), and the FET contact structure layers 18 are formed over the FET channel structure layers 16 (Step 204) to complete the layers for the FET epitaxial structure 20. The separation layer 22 is formed over the FET contact structure layers 18 (Step 206). The collector contact layer 24 is formed over the separation layer 22 (Step 208), the collector layers 26 are formed over the collector contact layer 24 (Step 210), the base layer 28 is formed over the collector layers 26 (Step 212), and then the emitter structure layers 30 are formed over the base layer 28 (Step 214) to complete the layers for the bipolar epitaxial structure 32. The emitter structure layers 30 are etched to form the emitter mesa 58 (Step 216), and a first metallization layer (not shown) is patterned and formed over the base layer 28 (Step 218). Using lift-off techniques, the ohmic metallic base connections 62 are provided to the base of the bipolar transistor element 36 (Step 220). The base layer 28 and the collector layers 26 are etched to form the base mesa 54, 56 (Step 222), the collector contact layer 24 is etched to form the collector mesa 52 (Step 224), and then the separation layer 22 is etched (Step 226). A second metallization layer (not shown) is patterned and formed over the collector contact layer 24 and the FET contact structure layers 18 (Step 228). Using lift-off and alloy techniques, the ohmic metallic collector connections 60 are provided to the collector of the bipolar transistor element 36, the ohmic metallic source connection 46 to the source of the FET element 34, and the ohmic metallic drain connection 48 to the drain of the FET element 34 (Step 230). The alloy also forms low resistance ohmic metallic base connections 62 to the base of the bipolar transistor element 36.

The transistor elements 34, 36 are isolated from one another using implant isolation (Step 232). The FET contact structure layers 18 are etched (Step 234). A third metallization layer (not shown) is patterned and formed over the FET channel structure layer 16 (Step 236). Using lift-off techniques, the Schottky metallic gate connection 50 is provided to the gate of the FET element 34 (Step 238). A fourth metallization layer (not shown) is then patterned and formed over of the emitter mesa 58 (Step 240). Using lift-off and techniques, the metallic emitter connection 64 is provided to the emitter of the bipolar transistor element 36 (Step 242). Alternate embodiments of the present invention may incorporate additional method steps, omit some method steps, alter some method steps, change the order in which the method steps are executed, or any combination thereof.

Figure 4:
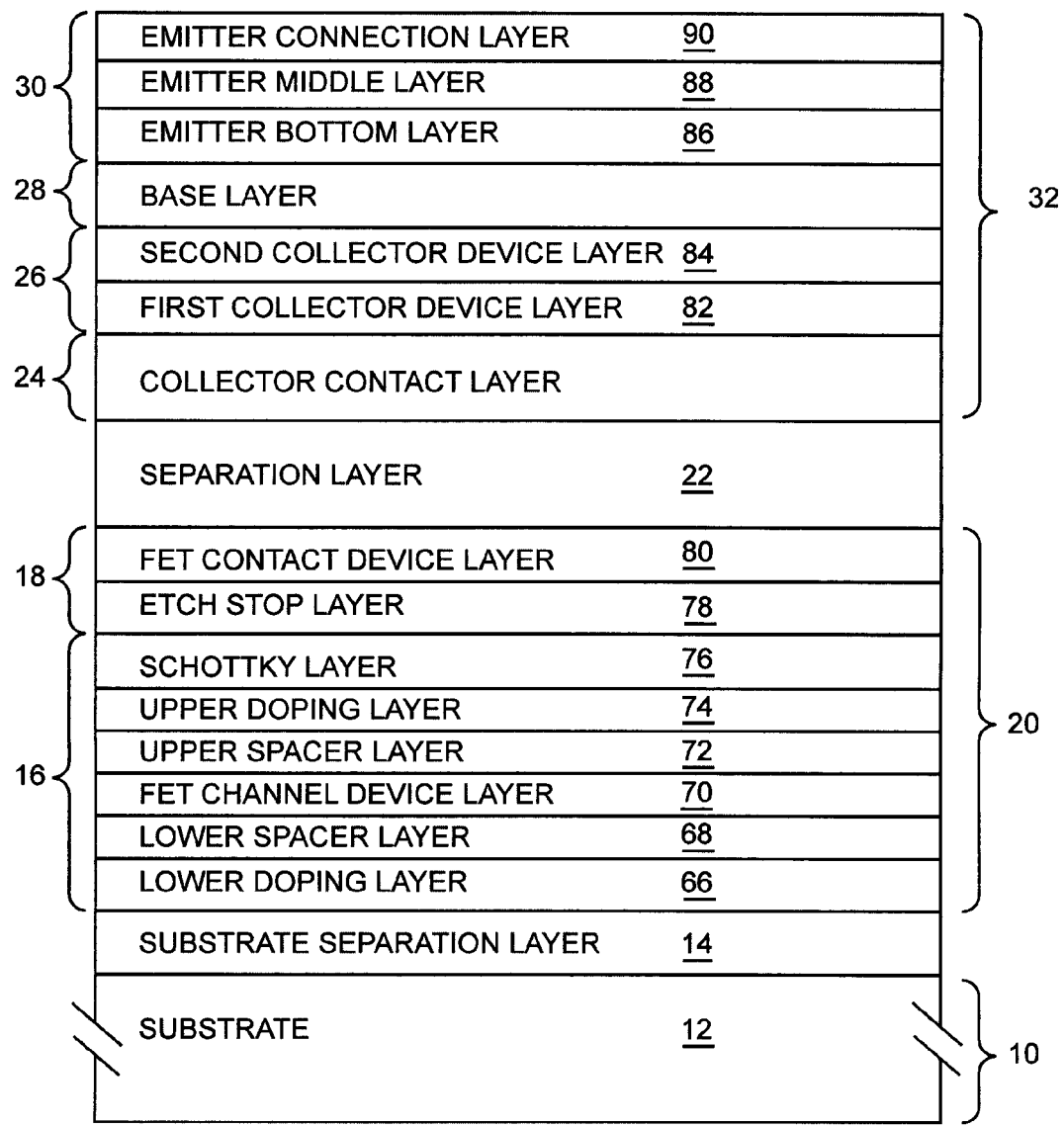
FIG. 4 shows details of the epitaxial layers illustrated in FIG. 1.

FIG. 4 shows details of the epitaxial layers illustrated in FIG. 1 in a detailed embodiment of the present invention. FIG. 4 is not drawn to scale. The FET channel structure layers 16 may include a lower doping layer 66 formed over the substrate separation layer 14, a lower spacer layer 68 formed over the lower doping layer 66, an FET channel device layer

70 formed over the lower spacer layer 68, an upper spacer layer 72 formed over the FET channel device layer 70, an upper doping layer 74 formed over the upper spacer layer 72, and a Schottky layer 76 formed over the upper doping layer 74. Alternate embodiments of the present invention may omit either or both of the doping layers 66, 74.

Either of the doping layers 66, 74 may be a bulk doping layer, a delta doping layer, or any combination thereof. Either or both of the doping layers 66, 74 may include N-type GaAs. Either or both of the spacer layers 68, 72 may include AlGaAs, GaAs, InGaP, or any combination thereof. The FET channel device layer 70 may include GaAs, Indium Gallium Arsenide (InGaAs), or both. The FET channel device layer 70 may be intentionally or unintentionally doped. The Schottky layer 76 may include AlGaAs, InGaP, N-type AlGaAs, N-type InGaP, P-type AlGaAs, P-type InGaP, or any combination thereof. In an alternate embodiment, the Schottky layer 76 may include alternating layers of AlGaAs and InGaP. The Schottky layer 76 may be intentionally or unintentionally doped. In an exemplary embodiment of the present invention, the spacer layers 68, 72 include AlGaAs, the FET channel device layer 70 includes InGaAs, and the Schottky layer 76 includes N-type AlGaAs. Any or all of the layers 66, 68, 70, 72, 74, 76 in the FET channel structure layers 16 may include multiple layers.

The FET contact structure layers 18 may include an etch stop layer 78 formed over the Schottky layer 76, and an FET contact device layer 80 formed over the etch stop layer 78. The etch stop layer 78 may include N-type AlAs, N-type InGaP, or both. Alternate embodiments of the present invention may use multiple etch stop layers 78. The FET contact device layer 80 may include N-type GaAs, InGaP, or both. Additional embodiments of the present invention may use multiple FET contact device layers 80.

The collector layers 26 may include a first collector device layer 82 formed over the collector contact layer 24 and a second collector device layer 84 formed over the first collector device layer 82. One or both of the collector device layers 82, 84 may include N-type GaAs. Alternate embodiments of the present invention may use a single collector layer 26. Additional embodiments of the present invention may include compositional grading of the collector layers, grading of the doping profile with the collector layers, or combinations thereof. Certain embodiments may include an additional separation layer (not shown) between the collector layer 26 and the collector contact layer 24 to enable the base mesa etch to stop directly on top of the collector contact layer 24. This separation layer may be composed of AlAs, AlGaAs, InGaP, or combinations thereof. The base layer 28 may include P-type GaAs, P-type InGaAsN, or combinations thereof. Alternate embodiments of the present invention may include multiple base layers 28. Additional embodiments of the present invention may include compositional grading of the base layers 28, grading of the doping profile with the base layers 28, or combinations thereof. The emitter structure layers 30 may include an emitter bottom layer 86 formed over the base layer 28, an emitter middle layer 88 formed over the emitter bottom layer 86, and an emitter connection layer 90 formed over the emitter middle layer 88. The emitter bottom layer 86 may include N-type AlGaAs, N-type InGaP, or both. The emitter middle layer 88 may include N-type GaAs. The emitter connection layer 90 may include N-type GaAs, N-type InGaAs, or both. Alternate embodiments of the present invention may include multiple emitter bottom layers 86, multiple emitter middle layers 88, multiple emitter connection layers 90, or any combination thereof. Any or all of the emitter structure layers 30 may include N-type AlGaAs, N-type InGaP, N-type GaAs, N-type InGaAs, or any combination thereof.

FIG. 5 shows details of the transistor elements 34, 36 illustrated in FIG. 2 in a detailed embodiment of the present invention. FIG. 5 is not drawn to scale. The upper and lower doping layers 74, 66, the upper and lower spacer layers 72, 68, the FET channel device layer 70, and the Schottky layer 76 provide the FET channel 42. The etch stop layer 78 and the FET contact device layer 80 provide the drain contact material 38 and the source contact material 40. The first and second collector device layers 82, 84 and the base device layer 28 provide the base mesa 54. The emitter middle and bottom layers 88, 86 and the emitter connection layer 90 provide the emitter mesa 58. Alternate embodiments of the present invention may include one or more additional layers, omit one or more layers, change one or more layers, or any combination thereof.

FIGS. 6A, 6B, and 6C illustrate a method for fabricating the transistor elements 34, 36 illustrated in FIG. 5. First, the substrate separation layer 14 is formed over the substrate 12 (Step 300). Then, the lower doping layer 66 is formed over the substrate separation layer 14 (Step 302), the lower spacer layer 68 is formed over the lower doping layer 66 (Step 304), the FET channel device layer 70 is formed over the lower spacer layer 68 (Step 306), the upper spacer layer 72 is formed over the FET channel device layer 70 (Step 308), the upper doping layer 74 is formed over the upper spacer layer 72 (Step 310), the Schottky layer 76 is formed over the upper doping layer 74 (Step 312), the etch stop layer 78 is formed over the Schottky layer 76 (Step 314), and then the FET contact device layer 80 is formed over the etch stop layer 78 (Step 316) to complete the layers for the FET epitaxial structure 20. The separation layer 22 is formed over the FET contact device layer 80 (Step 318). The collector contact layer 24 is formed over the separation layer 22 (Step 320), the first collector device layer 82 is formed over the collector contact layer 24 (Step 322), the second collector device layer 84 is formed over the first collector device layer 82 (Step 324), the base layer 28 is formed over the second collector device layer 84 (Step 326), the emitter bottom layer 86 is formed over the base layer 28 (Step 328), the emitter middle layer 88 is formed over the emitter bottom layer 86 (Step 330), and then the emitter connection layer 90 is formed over the emitter middle layer 88 (Step 332) to complete the layers for the bipolar epitaxial structure 32.

The emitter connection layer 90 and the emitter middle layer 88 are etched to form the emitter mesa 58 (Step 334). A first metallization layer (not shown) is patterned and formed over the emitter bottom layer 86 and the base layer 28 (Step 336). The first metallization layer may include Platinum, Palladium, Titanium, Platinum, Gold, Germanium, an alloy of Gold and Beryllium (AuBe), an alloy of Gold and Germanium (AuGe), any combination thereof, or the like. Additionally, the first metallization layer may include one or more sub-layers, each of which may include Platinum, Palladium, Titanium, Platinum, Gold, the like, or any combination thereof. In a first exemplary embodiment of the present invention, the first metallization layer includes a first sub-layer of Platinum or Palladium, a second sub-layer of Titanium, a third sub-layer of Platinum or Palladium, a fourth sub-layer of Gold, or any combination thereof. In a second exemplary embodiment of the present invention, the first metallization layer includes a first sub-layer of an alloy of Gold and Beryllium (AuBe), a second sub-layer of Palladium or Platinum, a third sub-layer of Gold, or any combination thereof. Using lift-off and alloy techniques, the metallic base connections 62 are provided to the emitter bottom layer 86 of the bipolar transistor element 36 (Step 338).

The emitter bottom layer 86, the base layer 28, and the second and first collector device layers 84, 82 are etched to form the base mesa 54, 56 (Step 340). The collector contact layer 24 is etched to form the collector mesa 52 (Step 342), and then the separation layer 22 is etched (Step 344). A second metallization layer (not shown) is patterned and formed over the collector contact layer 24 and the FET contact device layer 80 (Step 346). The second metallization layer may include Platinum, Palladium, Titanium, an alloy of Gold and Beryllium, an alloy of Gold and Germanium, Germanium, Nickel, Gold, any combination thereof, or the like. Additionally, the second metallization layer may include one or more sub-layers, each of which may include Germanium, an alloy of Gold and Germanium, Nickel, Gold, the like, or any combination thereof. In an exemplary embodiment of the present invention, the second metallization layer includes a first sub-layer of Gold, a second sub-layer of a Germanium alloy, a third sub-layer of Nickel, a fourth sub-layer of Gold, or any combination thereof. Using lift-off and alloy techniques, the ohmic metallic collector connections 60 are provided to the collector of the bipolar transistor element 36, the ohmic metallic source connection 46 to the source of the FET element 34, the ohmic metallic drain connection 48 to the drain of the FET element 34, and the ohmic metallic base connections 62 to the base of the bipolar transistor element 36 (Step 348). The transistor elements 34, 36 are isolated from one another using implant isolation (Step 350).

The FET contact device layer 80 is etched (Step 352), and the etch stop layer 82 is etched (Step 354). A third metallization layer (not shown) is patterned and formed over the Schottky layer 76 (Step 356). The third metallization layer may include Platinum, Palladium, Titanium, Platinum, Gold, the like, or any combination thereof. Additionally, the first metallization layer may include one or more sub-layers, each of which may include Platinum, Palladium, Titanium, Platinum, Gold, the like, or any combination thereof. In an exemplary embodiment of the present invention, the third metallization layer includes a first sub-layer of Titanium, a second sub-layer of Platinum or Palladium, a third sub-layer of Gold, or any combination thereof. Using lift-off techniques, the Schottky metallic gate connection 50 is provided to the gate of the FET element 34 (Step 358).

A fourth metallization layer (not shown) is patterned and formed on top of the emitter mesa 58 (Step 360). The fourth metallization layer may include Platinum, Palladium, Titanium, an alloy of Gold and Beryllium, an alloy of Gold and Germanium, Germanium, Nickel, Gold, any combination thereof, or the like. Additionally, the fourth metallization layer may include one or more sub-layers, each of which may include Platinum, Palladium, Titanium, Platinum, Gold, the like, or any combination thereof. Additionally, the fourth metallization layer may include one or more sub-layers, each of which may include Gold, Germanium, Nickel, a Gold-Germanium alloy, the like, or any combination thereof. In an exemplary embodiment of the present invention, the fourth metallization layer includes a first sub-layer of Gold, Germanium, Nickel, or any combination thereof, a second sub-layer of a Gold-Germanium alloy, a third sub-layer of Nickel, and a fourth sub-layer of Gold. In an exemplary embodiment of the present invention, the fourth metallization layer includes a first sub-layer of Titanium, a second sub-layer of Platinum or Palladium, a third sub-layer of Gold, a fourth sub-layer of Titanium, or any combination thereof. Using lift-off techniques, the ohmic metallic emitter connection 64 is provided to the emitter of the bipolar transistor element 36 (Step 362).

Alternate embodiments of the present invention may incorporate additional method steps, omit some method steps, alter some method steps, change the order in which the method steps are executed, or any combination thereof.

The emitter bottom layer 86 may include AlGaAs or InGaP. When the emitter bottom layer 86 includes AlGaAs and the bipolar transistor element 36 provides a heterojunction bipolar transistor element (HBT), the HBT is an AlGaAs HBT. Additionally, when the emitter bottom layer 86 includes InGaP and the bipolar transistor element 36 provides an HBT, the HBT is an InGaP HBT.

Those skilled in the art will recognize improvements and modifications to the preferred embodiments of the present invention. All such improvements and modifications are considered within the scope of the concepts disclosed herein and the claims that follow.

What is claimed is:

1. A microelectronic device comprising:
   a Gallium Arsenide substrate;
   a first epitaxial structure formed over the substrate and comprising a field effect transistor (FET) channel structure, which comprises:
      at least one FET channel device layer; and
      at least one Schottky layer formed over the at least one FET channel device layer,
   wherein the first epitaxial structure provides at least one FET element;
   at least one separation layer formed over the first epitaxial structure; and
   a second epitaxial structure formed over the at least one separation layer and providing at least one bipolar transistor element.

2. The microelectronic device of claim 1 wherein the at least one FET element comprises at least one selected from a group consisting of a heterojunction insulated gate FET element, a modulation doped FET element, a junction FET element, and a heterostructure FET element.

3. The microelectronic device of claim 1 wherein the at least one FET element comprises a heterostructure FET element.

4. The microelectronic device of claim 1 wherein the at least one Schottky layer comprises N-type Aluminum Gallium Arsenide.

5. The microelectronic device of claim 1 wherein the at least one Schottky layer comprises N-type Indium Gallium Phosphide.

6. The microelectronic device of claim 1 wherein the at least one FET element comprises a junction FET element.

7. The microelectronic device of claim 1 wherein the at least one FET element comprises modulation doped FET element.

8. The microelectronic device of claim 7 wherein the second epitaxial structure comprises:
   at least one P-type Gallium Arsenide base layer; and
   at least one N-type Aluminum Gallium Arsenide emitter layer formed over the base layer.

9. The microelectronic device of claim 7 wherein the second epitaxial structure comprises:
   at least one P-type Gallium Arsenide base layer; and
   at least one N-type Indium Gallium Phosphide emitter layer formed over the base layer.

10. The microelectronic device of claim 7 wherein the second epitaxial structure comprises:
    at least one P-type Indium Gallium Arsenide Nitride base layer; and
    at least one N-type Indium Gallium Phosphide emitter layer formed over the base layer.

11. The microelectronic device of claim 1 wherein the at least one separation layer comprises Aluminum Arsenide.

12. The microelectronic device of claim 1 wherein the at least one separation layer comprises Aluminum Gallium Arsenide.

13. The microelectronic device of claim 1 wherein the at least one separation layer comprises Indium Gallium Phosphide.

14. The microelectronic device of claim 1 wherein:
the at least one field effect transistor element comprises at least one pseudomorphic high electron mobility transistor element;
the at least one separation layer comprises Indium Gallium Phosphide;
the at least one bipolar transistor element comprises at least one heterojunction bipolar transistor element; and
the second epitaxial structure comprises at least one Indium Gallium Phosphide emitter layer formed over a base layer.

15. The microelectronic device of claim 1 wherein:
the at least one field effect transistor element comprises at least one pseudomorphic high electron mobility transistor element;
the at least one separation layer comprises Aluminum Arsenide;
the at least one bipolar transistor element comprises at least one heterojunction bipolar transistor element; and
the second epitaxial structure comprises at least one Aluminum Gallium Arsenide emitter layer formed over a base layer.

16. The microelectronic device of claim 1 wherein the first epitaxial structure further comprises
at least one contact device layer formed over the at least one Schottky layer.

17. The microelectronic device of claim 1 wherein the first epitaxial structure further comprises:
a substrate separation layer formed over the substrate;
a lower doping layer formed over the substrate separation layer;
a lower spacer layer formed over the lower doping layer;
the at least one FET channel device layer formed over the lower spacer layer;
an upper spacer layer formed over the at least one FET channel device layer;
an upper doping layer formed over the upper spacer layer;
the at least one Schottky layer formed over the upper doping layer;
an etch stop layer formed over the at least one Schottky layer; and
a contact device layer formed over the etch stop layer.

18. The microelectronic device of claim 1 wherein the second epitaxial structure comprises:
at least one collector contact layer;
at least one collector device layer formed over the at least one collector contact layer;
at least one base layer formed over the at least one collector device layer; and
at least one emitter layer formed over the at least one base layer.

19. The microelectronic device of claim 1 wherein the second epitaxial structure comprises:
a collector contact layer formed over the at least one separation layer;
a first collector device layer formed over the collector contact layer;
a second collector device layer formed over the first collector device layer;
a base layer formed over the second collector device layer;
an emitter bottom layer formed over the base layer;
an emitter middle layer formed over the emitter bottom layer; and
an emitter connection layer formed over the emitter middle layer.

20. The microelectronic device of claim 1 wherein the second epitaxial structure comprises:
a base layer formed over the at least one separation layer;
an emitter bottom layer formed over the base layer; and
a metallization layer formed over the emitter bottom layer and comprising at least one of Platinum, Palladium, Titanium, a Gold-Beryllium alloy, a Gold-Germanium alloy, Germanium, and Gold,
wherein the metallization layer is diffused through the emitter bottom layer to provide at least one electrical connection to the base layer.

21. The microelectronic device of claim 1 wherein the second epitaxial structure comprises:
a base layer formed over the at least one separation layer; and
a metallization layer formed over the base layer and comprising at least one of Platinum, Palladium, Titanium, a Gold-Beryllium alloy, a Gold-Germanium alloy, Germanium, and Gold,
wherein the metallization layer provides at least one electrical connection to the base layer.

22. The microelectronic device of claim 1 wherein the second epitaxial structure comprises:
at least one collector contact layer;
at least one collector etch stop layer formed over the at least one collector contact layer;
at least one collector device layer formed over the at least one collector etch stop layer;
at least one base layer formed over the at least one collector device layer; and
at least one emitter layer formed over the at least one base layer.

23. A method comprising:
providing a microelectronic device having a Gallium Arsenide substrate;
forming a first epitaxial structure over the substrate and comprising forming a field effect transistor (FET) channel structure, which comprises:
forming at least one FET channel device layer; and
forming at least one Schottky layer over the at least one FET channel device layer,
wherein the first epitaxial structure provides at least one FET element;
forming at least one separation layer over the first epitaxial structure; and
forming a second epitaxial structure over the at least one separation layer to provide at least one bipolar transistor element.

* * * * *